(12) United States Patent
Sun et al.

(10) Patent No.: US 10,158,952 B2
(45) Date of Patent: *Dec. 18, 2018

(54) MEMS MICROPHONE AND METHOD OF MANUFACTURING THE SAME

(71) Applicant: DONGBU HITEK CO., LTD., Seoul (KR)

(72) Inventors: Jong Won Sun, Gyeonggi-do (KR); Han Choon Lee, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/497,366

(22) Filed: Apr. 26, 2017

(65) Prior Publication Data

US 2017/0311088 A1 Oct. 26, 2017

(30) Foreign Application Priority Data

Apr. 26, 2016 (KR) .................. 10-2016-0050894

(51) Int. Cl.
*H04R 19/04* (2006.01)
*B81B 7/00* (2006.01)
(Continued)

(52) U.S. Cl.
CPC .......... *H04R 19/04* (2013.01); *B81B 7/0061* (2013.01); *B81C 1/00158* (2013.01); *H04R 7/18* (2013.01);
(Continued)

(58) Field of Classification Search
CPC ............. H04R 19/04; H04R 19/005; H04R 2201/003; B81B 3/0072
(Continued)

(56) References Cited

U.S. PATENT DOCUMENTS

| 8,942,394 B2* | 1/2015 | Conti | H04R 7/24 381/174 |
| 2006/0233401 A1* | 10/2006 | Wang | B81B 3/0072 381/176 |
| 2016/0362292 A1 | 12/2016 | Chang | |

FOREIGN PATENT DOCUMENTS

| KR | 10-2010-0073051 | 7/2010 |
| KR | 10-1462375 | 11/2014 |
| KR | 10-1578542 | 12/2015 |

OTHER PUBLICATIONS

U.S. Appl. No. 15/497,374, filed Apr. 26, 2017. Inventors: Sun et al.
(Continued)

*Primary Examiner* — Sunita Joshi
(74) *Attorney, Agent, or Firm* — Patterson Thuente Pedersen, P.A.

(57) ABSTRACT

A MEMS microphone includes a substrate having a cavity, a back plate disposed over the substrate and having a plurality of acoustic holes, a diaphragm disposed between the substrate and the back plate, and an anchor extending from a circumference of the diaphragm to be connected with an end portion of the diaphragm. The diaphragm is spaced apart from the substrate and the back plate to covers the cavity, and the diaphragm senses an acoustic pressure to generate a displacement. The anchor extends from a circumference of the diaphragm to be connected with an end portion of the diaphragm, and is connected with the substrate to support the diaphragm. Thus, the MEMS microphone can prevent a portion of an insulation layer located around the anchor from remaining and can prevent a buckling phenomenon of the diaphragm from occurring.

5 Claims, 7 Drawing Sheets

(51) Int. Cl.
*B81C 1/00* (2006.01)
*H04R 7/18* (2006.01)
*H04R 19/00* (2006.01)
*H04R 31/00* (2006.01)

(52) U.S. Cl.
CPC ......... *H04R 19/005* (2013.01); *H04R 31/003* (2013.01); *B81B 2201/0257* (2013.01); *B81B 2203/0127* (2013.01); *B81B 2203/0315* (2013.01); *B81C 2201/013* (2013.01); *B81C 2201/0109* (2013.01); *H04R 2201/003* (2013.01)

(58) Field of Classification Search
USPC ............... 381/175, 174, 181, 190, 191, 178; 367/170, 178, 163, 174
See application file for complete search history.

(56) References Cited

OTHER PUBLICATIONS

U.S. Appl. No. 15/497,358, filed Apr. 26, 2017. Inventors: Sun et al.
Application and Filing Receipt for U.S. Appl. No. 15/414,104, filed Jan. 24, 2017. Inventors: Lee et al.
Application and Filing Receipt for U.S. Appl. No. 15/414,125, filed Jan. 24, 2017. Inventors: Lee et al.
Korean Office Action, Korean Application No. 10-2016-0050894, dated Feb. 22, 2018, 3 pages (7 pages with translation).
Korean Final Office Action, Korean Application No. 10-2016-0050894, dated Jun. 26, 2018, 4 pages (7 pages with translation).

\* cited by examiner

[FIG. 1]
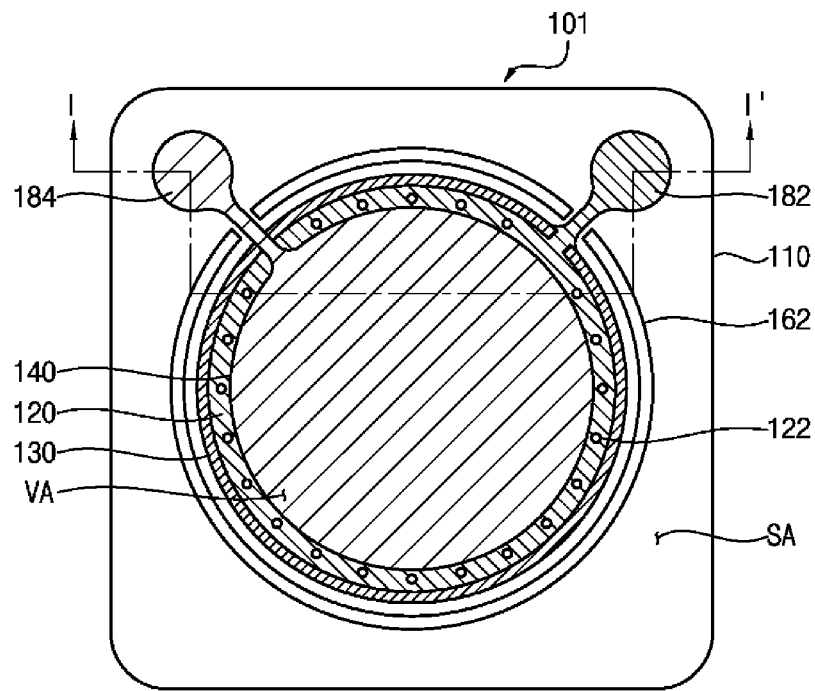
[FIG. 2]
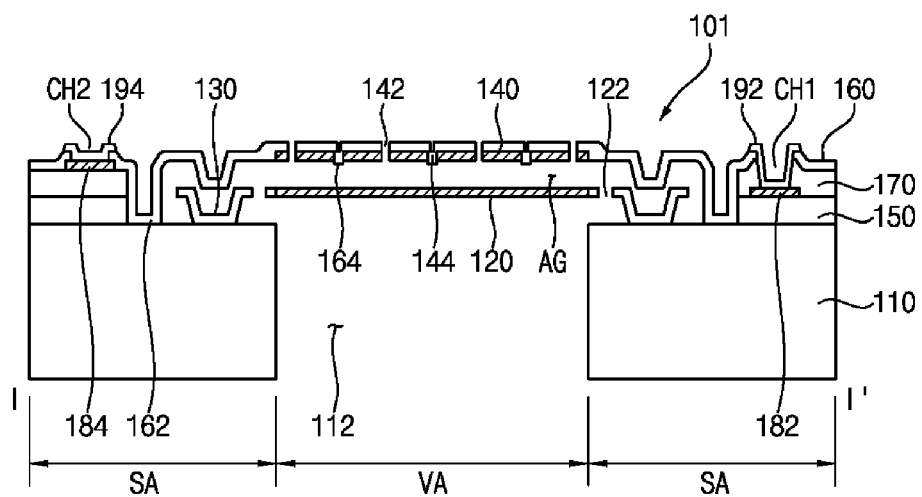

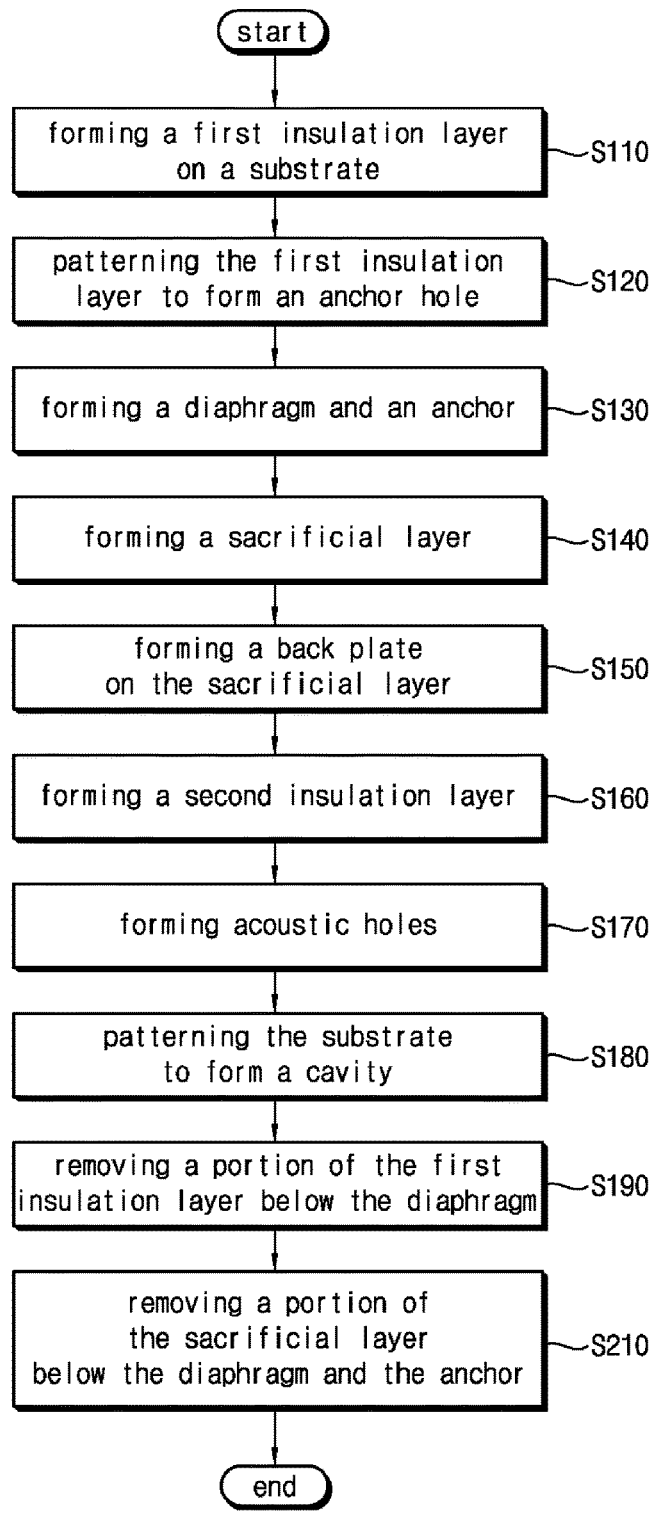
[FIG. 3]

[FIG. 4]
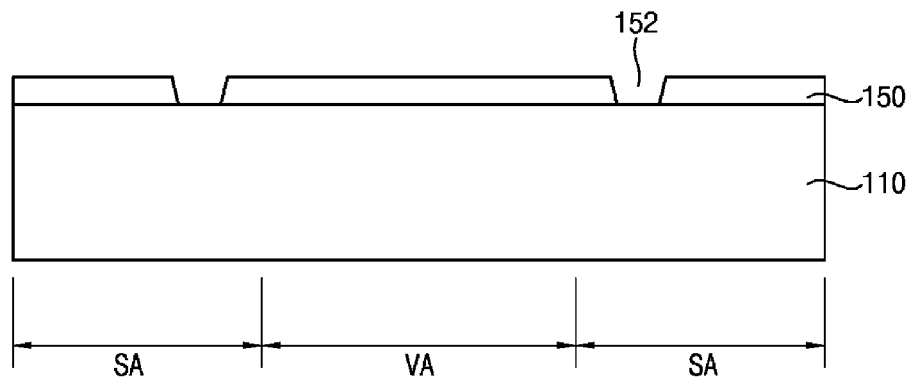
[FIG. 5]
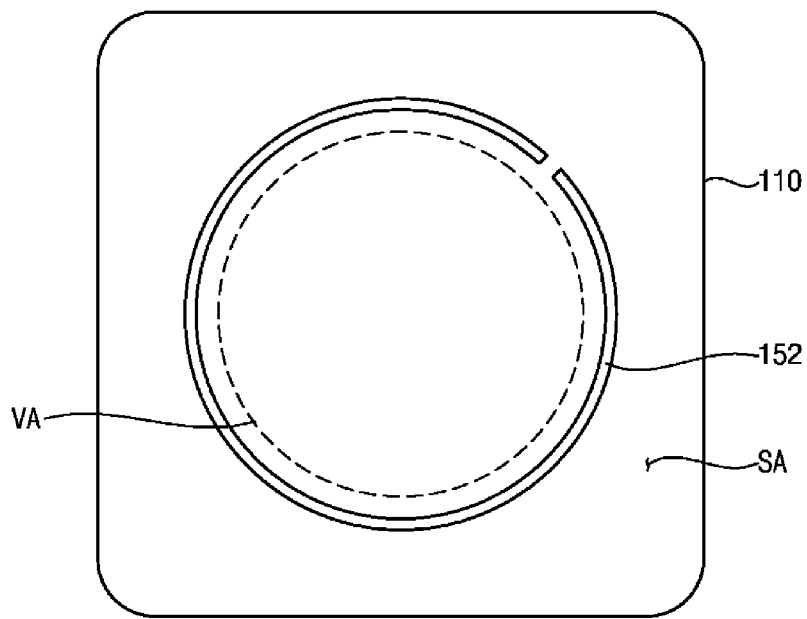

[FIG. 6]
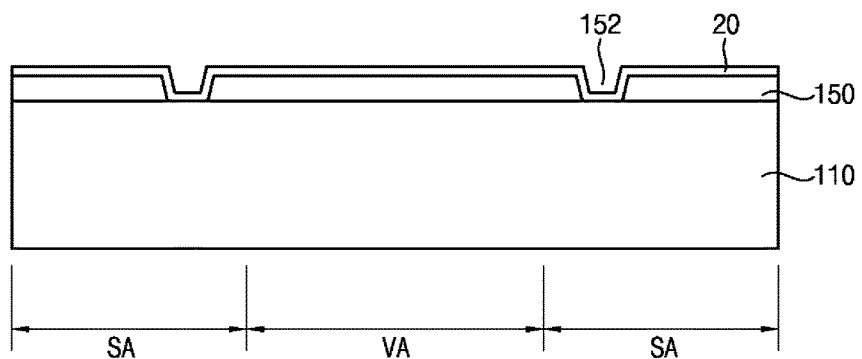
[FIG. 7]
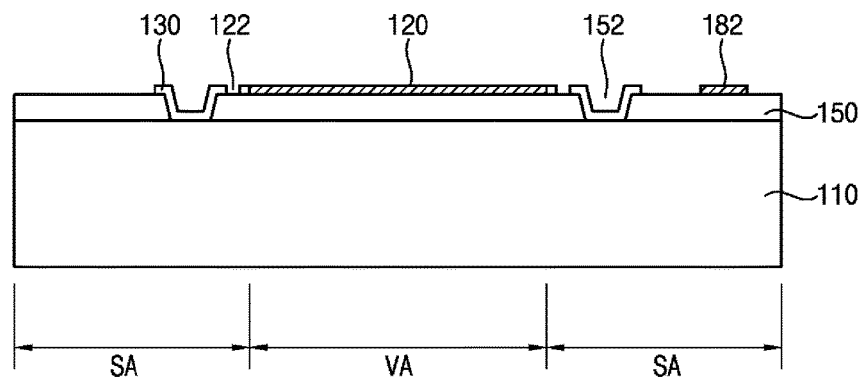

[FIG. 8]
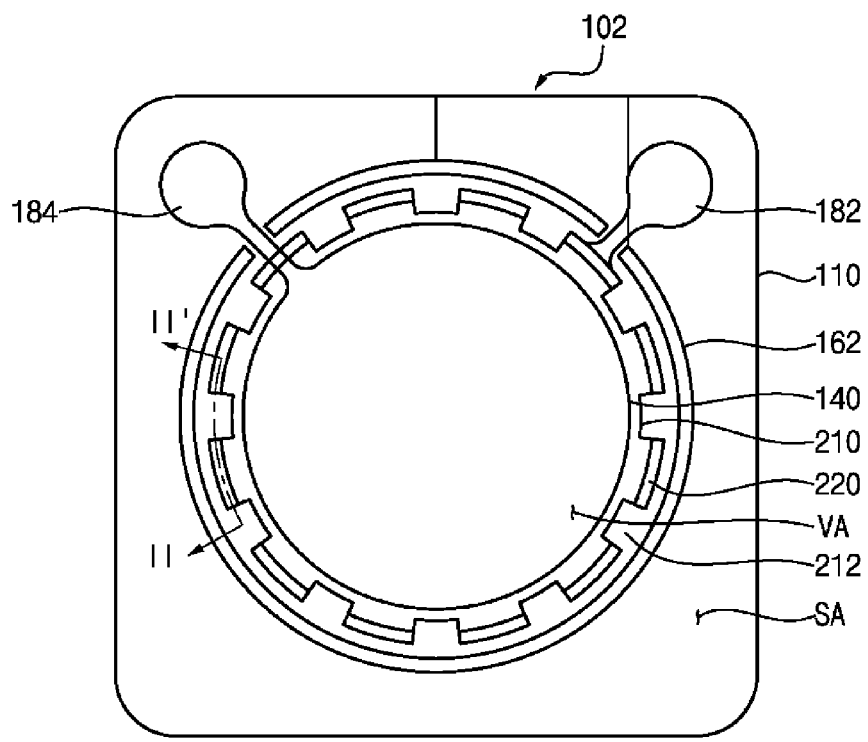
[FIG. 9]
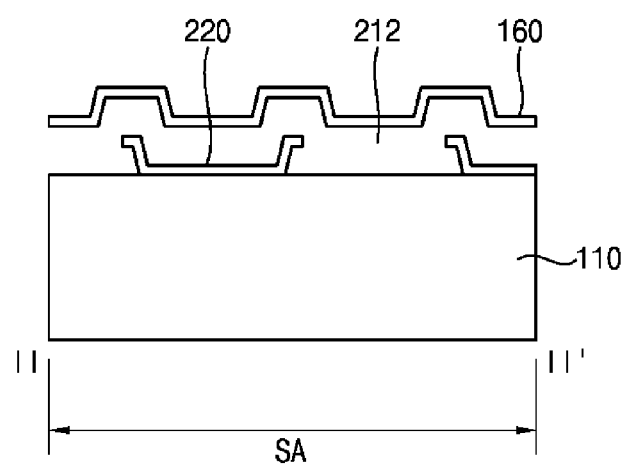

[FIG. 10]
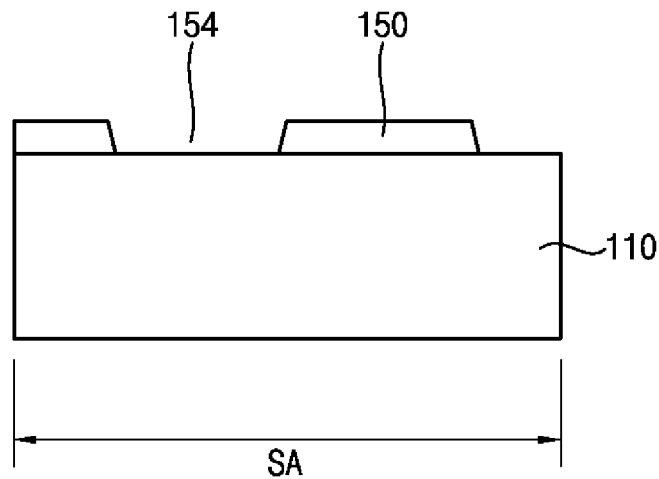
[FIG. 11]
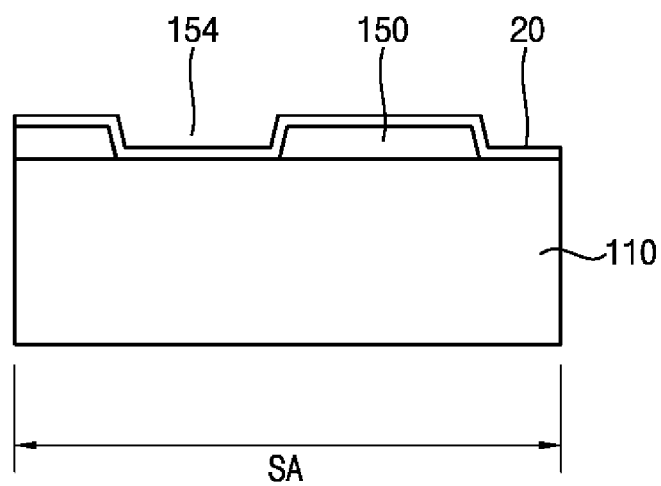

[FIG. 12]
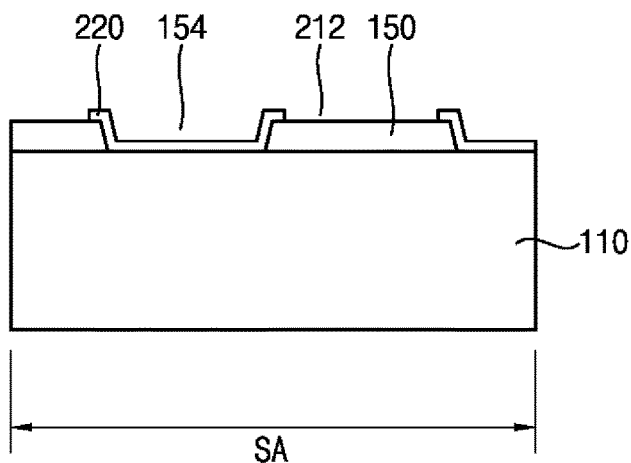
[FIG. 13]
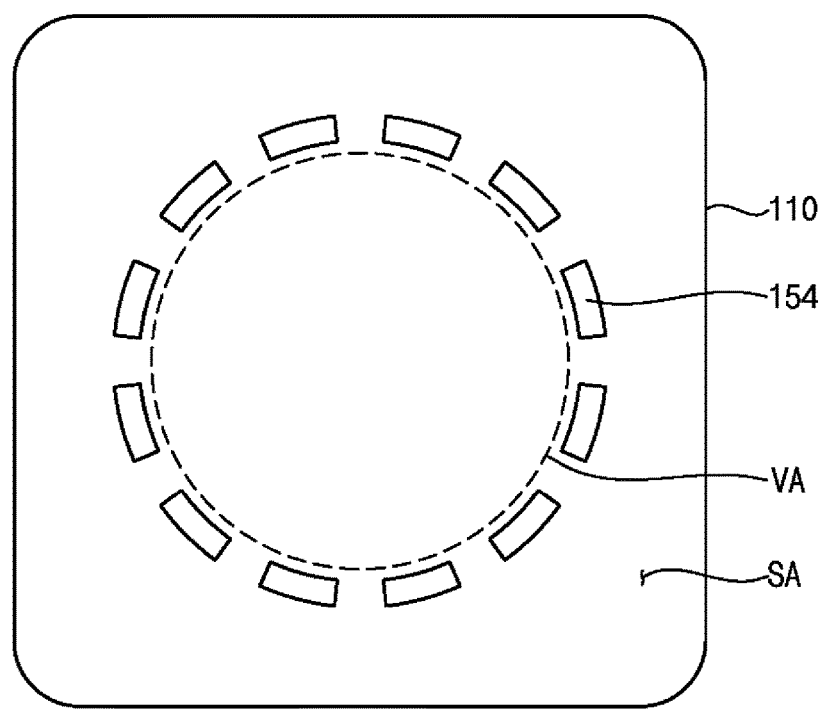

MEMS MICROPHONE AND METHOD OF MANUFACTURING THE SAME

CROSS-REFERENCE TO RELATED APPLICATION

This application claims priority to Korean Patent Application No. 10-2016-0050894, filed on Apr. 26, 2016 and all the benefits accruing therefrom under 35 U.S.C. § 119, the contents of which are incorporated by reference in their entirety.

TECHNICAL FIELD

The present disclosure relates to MEMS microphones capable of converting an acoustic wave into an electrical signal, and a method of manufacturing such a MEMS microphone. More particularly, embodiments described herein relate to capacitive MEMS microphones capable of detecting an acoustic pressure to generate a displacement and transmit an acoustic signal.

BACKGROUND

Generally, a capacitive microphone utilizes a capacitance between a pair of electrodes which are facing each other to generate an acoustic signal. A MEMS microphone includes a diaphragm being bendable and a back plate which is facing the diaphragm. The diaphragm can be a membrane structure to perceive an acoustic pressure to create a displacement.

In particular, when the acoustic pressure is applied to the diaphragm, the diaphragm may be bent toward the back plate due to the acoustic pressure. The displacement of the diaphragm can be perceived through a change of capacitance formed between the diaphragm and the back plate. As a result, an acoustic wave can be converted into an electrical signal for output.

The capacitive microphone can be manufactured by a semiconductor MEMS process such that the capacitive microphone has an ultra-small size. The diaphragm is spaced apart from a substrate to be freely bended upwardly or downwardly with responding to sound. The MEMS microphone has a plurality of anchors at end portions of the diaphragm. The anchors are spaced apart from each other along an end portion of the diaphragm. The anchors make contact with the substrate to stably support the diaphragm which is spaced apart from the substrate. The anchors are formed integrally with the diaphragm and are formed together in a process of forming the diaphragm.

Each of the anchors may have a cylindrical shape. The insulation layer located between the anchors may not be completely removed in a process of the MEMS microphone such that the insulation layer partially remains on the substrate. That is, a method of manufacturing the MEMS microphone includes a step of removing a portion of the insulation layer located between a diaphragm and a substrate, and a step of removing a sacrificial layer located between a diaphragm and a back plate to allow the diaphragm to freely move with responding to sound. In order to remove the insulation layer disposed under the diaphragm, an etchant may be provided to the insulation layer through a cavity formed in the substrate.

However, it may not be easy for the etchant to flow between the anchors and the interval between the anchors is also narrow such that the etchant may not reach the insulation layer. Thus, it may be not easy to completely remove the insulation layer located between the anchors. As a result, a portion of the insulation layer located between the anchors cannot be completely removed, and the remnant portion of the insulation layer may prevent the diaphragm from moving freely. Further, a buckling phenomenon in which the diaphragm cannot return to an initial position after being bent toward the back plate may occur to disturb the movement of sound wave.

SUMMARY

The example embodiments of the present invention provides a MEMS microphone capable of completely removing a portion of an insulation layer disposed under a diaphragm to prevent a buckling phenomenon from occurring The example embodiments of the present invention provides a method of manufacturing a MEMS microphone capable of completely removing a portion of an insulation layer disposed under a diaphragm to prevent a buckling phenomenon from occurring According to an example embodiment of the present invention, a MEMS microphone includes a substrate having a cavity, a back plate disposed over the substrate and having a plurality of acoustic holes, a diaphragm disposed between the substrate and the back plate, the diaphragm being spaced apart from the substrate and the back plate to cover the cavity, the diaphragm sensing an acoustic pressure to create a displacement, and an anchor extending from a circumference of the diaphragm to be connected with an end portion of the diaphragm, the anchor being connected with the substrate to support the diaphragm.

In an example embodiment, the anchor may have a ring shape to surround the diaphragm.

In an example embodiment, the diaphragm may include a plurality of vent holes to serve as a flow path through which an etchant for removing a sacrificial layer formed between the diaphragm and the back plate flows to be spaced apart from each other.

In an example embodiment, the vent holes may be spaced apart from each other along the anchor.

In an example embodiment, the anchor may be formed in plural, a plurality of anchors is spaced apart from each other along the circumference of the diaphragm, and each of the anchors has an arc shape.

In an example embodiment, the diaphragm may include a plurality of slits to serve as a flow path through which an etchant for removing a sacrificial layer formed between the diaphragm and the back plate flows to be spaced apart from each other, and the slits are disposed between two adjacent anchors.

In an example embodiment, the anchor may have a dam shape.

According to an example embodiment of the present invention, a MEMS microphone includes a substrate having a cavity, the substrate being divided into a vibration area and a peripheral area surrounding the vibration area, a diaphragm disposed over the substrate to cover the cavity, the diaphragm being spaced apart from the substrate, and sensing an acoustic pressure to create a displacement, a back plate disposed over the diaphragm and in the vibration area, the back plate being spaced apart from the diaphragm to face the diaphragm and having a plurality of acoustic holes, and an anchor extending from a circumference of the diaphragm in the peripheral area, the anchor connecting the diaphragm to the substrate.

In an example embodiment, the anchor may have a ring shape to surround the diaphragm.

In an example embodiment, the vibration area may correspond to the cavity, the diaphragm may include a plurality of vent holes to serve as a flow path through which an etchant for removing a sacrificial layer formed between the diaphragm and the back plate flows to be spaced apart from each other, and the vent holes may be spaced apart from each other along the anchor and in the peripheral area to be closer to the vibration area than the anchor.

In an example embodiment, the anchor may be in plural, a plurality of anchors is spaced apart from each other along a circumference of the vibration area, and the vibration area corresponds to the cavity.

In an example embodiment, the diaphragm may include a plurality of slits to serve as a flow path through which an etchant for removing a sacrificial layer formed between the diaphragm and the back plate flows to be spaced apart from each other, and the slits are disposed between two adjacent anchors, and the slits are located in the peripheral area.

In an example embodiment, the slits may be spaced apart from each other along a circumference of the vibration area to surround the vibration area.

According to an example embodiment of the present invention of a method of manufacturing a MEMS microphone, an insulation layer is formed on a substrate being divided into a vibration area and a peripheral area surrounding the vibration region. The insulation layer is patterned to form an anchor hole for forming an anchor in the peripheral area, the anchor hole extending along a circumference of the vibration area. A diaphragm and an anchor are formed on the insulation layer through which the anchor hole is formed, the anchor being connected to the diaphragm. After a sacrificial layer is formed on the insulation layer to cover the diaphragm and the anchor, a back plate is formed on the sacrificial layer to face the diaphragm. The back plate is patterned to form a plurality of acoustic holes which penetrates through the back plate. After the substrate is patterned to form a cavity in the vibration area to partially expose a lower face of the insulation layer, a portion of the insulation layer which is located under the diaphragm is removed through an etching process using the cavity as a mask. A portion of the sacrificial layer, which corresponds to the diaphragm and the anchor, is removed.

In an example embodiment, the anchor hole may be formed in a ring shape to surround the vibration area.

In an example embodiment, forming the diaphragm may include forming vent holes in the peripheral area, each of the vent holes may serve as a flow path of the etchant for removing the sacrificial layer.

In an example embodiment, the anchor hole may be formed in plural for form a plurality of anchors, anchor holes may be spaced apart from each other along a circumference of the vibration area.

In an example embodiment, the diaphragm may be further patterned to form a plurality of slits in the peripheral area, the silts may be spaced apart from each other along a circumference of the vibration area, and each of the slits may serve as a flow path of the etchant for removing the sacrificial layer.

According to example embodiments of the present invention as described above, the MEMS microphone includes an anchor extending from an end portion of the diaphragm along a circumference of the diaphragm such that a portion of an insulation layer located under the diaphragm is completely removable in a process of manufacturing the MEM microphone. Thus, the MEMS microphone can prevent the portion of the insulation layer adjacent the anchor from remaining such that a buckling phenomenon which may occur due to a remnant portion of the insulation layer can be prevented and a smooth flow of acoustic wave can be achieved.

BRIEF DESCRIPTION OF THE DRAWINGS

Exemplary embodiments can be understood in more detail from the following description taken in conjunction with the accompanying drawings, in which:

FIG. 1 is a plan view illustrating a MEMS microphone in accordance with an example embodiment of the present invention;

FIG. 2 is a cross sectional view taken along the line I-I' depicted in FIG. 1;

FIG. 3 is a flow chart illustrating a method of manufacturing a MEMS microphone in accordance with an example embodiment of the present invention;

FIG. 4 is a cross sectional view illustrating a step of forming the anchor holes in FIG. 3;

FIG. 5 is a plan view illustrating the anchor hole in FIG. 4;

FIGS. 6 and 7 are cross sectional views illustrating a step of forming the diaphragm and the anchor in FIG. 3;

FIG. 8 is a plan view illustrating a MEMS microphone in accordance with an example embodiment of the present invention;

FIG. 9 is a cross sectional view taken along the line II-II' depicted in FIG. 8;

FIGS. 10 to 12 are cross sectional views illustrating a method of manufacturing a MEMS microphone in accordance with an example embodiment of the present invention; and FIG. 13 is a plan view illustrating the anchor holes in FIG. 10.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. By contrast, it will also be understood that when a layer, a film, a region or a plate is referred to as being 'directly on' another one, it is directly on the other one, and one or more intervening layers, films, regions or plates do not exist. Also, although terms such as a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

FIG. 1 is a plan view illustrating a MEMS microphone in accordance with an example embodiment of the present invention. FIG. 2 is a cross sectional view taken along a line I-I' as depicted in FIG. 1.

Referring to FIGS. 1 and 2, a MEMS microphone 101 in accordance with an example embodiment of the present invention is capable of creating a displacement in response to an acoustic pressure to convert sound wave into an electrical signal and output the electrical signal. The MEMS microphone 101 includes a substrate 110, a diaphragm 120, an anchor 130 and a back plate 140.

In particular, the substrate 110 is divided into a vibration area VA and a peripheral area SA. In the vibration area VA, a cavity 112 is formed in substrate 110.

In an example embodiment, the vibration area VA may be defined to correspond to the cavity 112.

The diaphragm 120 may be formed to have a membrane structure. The diaphragm 120 may cover the cavity 112 over the substrate 110, and the diaphragm 120 may be exposed through the cavity 112. The diaphragm 120 is bendable with responding to the acoustic pressure and the diaphragm 120 is apart from the substrate 110. The diaphragm 120 may have an ion implantation region into which impurities are doped, which corresponds to the vibration area VA.

In an example embodiment, the diaphragm 120 may have a shape of a disc plate, and the cavity 112 may have a circular cylindrical shape.

The anchor 130 is positioned at an end portion of the diaphragm 120. The anchor 120 supports the diaphragm 120 which is spaced apart from the substrate 110. The anchor 130 is positioned in the peripheral area SA of the substrate 110. The anchor 130 may have a lower face to make contact with an upper face of the substrate 110. The anchor 130 may extend along a circumference of the diaphragm 120 to surround the vibration area VA.

In an example embodiment of the present invention, the anchor 130 may be formed to have a ring shape as shown in FIG. 1, and may have a dam-like cross-sectional shape. The longitudinal section of the anchor 130 may have a U-shape as shown in FIG. 2.

In an example embodiment of the present invention, the MEMS microphone 101 includes one anchor 130 formed in a dam shape, which surrounds the diaphragm 120. Thus, an insulation layer may not remain between the anchors, after performing a process of removing the insulation layer, comparing with the conventional art that a plurality of anchors is formed such that a remnant portion of the insulation layer may exist between the anchors. Accordingly, the insulation layer may be completely removed from the substrate, hereby preventing the buckling phenomenon which may occur due to the remnant portion of the insulation layer from happening.

The back plate 140 may be formed over the diaphragm 120. The back plate 140 may be disposed in the vibration area VA and may be provided to face the diaphragm 120. Like the diaphragm 120, the back plate 140 may be doped with impurities through an ion implantation process.

The back plate 140 may be spaced apart from the diaphragm 120 so that the diaphragm 120 can be freely bended toward the back plate 140. Accordingly, the diaphragm 120 and the back plate 140 are spaced apart from each other to form an air gap AG. The air gap AG is formed by removing a sacrificial layer which is interposed between the diaphragm 120 and the back plate 140 to separate the diaphragm 120 from the back plate 140.

The diaphragm 120 may have a plurality of vent holes 122 for each providing a flow path through which an etchant flows in order to remove a sacrificial layer between the diaphragm 120 and the back plate 140 using the etchant. When the etchant flows from the cavity 112 through the vent holes 122, the sacrificial layer between the diaphragm 120 and the back plate 140 is removed using the etchant to form the air gap AG between the diaphragm 120 and the back plate 140.

As shown in FIG. 1, the vent holes 122 are formed in the peripheral area SA and are spaced apart from one another along the anchor 130 to surround the vibration region VA. Further, the vent holes 122 are formed by penetrating through the diaphragm 120 in a vertical direction, and are located at a position between the cavity 112 and the anchor 130 in a horizontal direction. Each of the vent holes 122 may serves as a path for the acoustic wave. Further, each of the vent holes 122 may also function as a flow path of the etchant for removing the sacrificial layer between the diaphragm 120 and the back plate 140 while forming the air gap (AG).

In some example embodiments, the MEMS microphone 101 may further include a first insulation layer 150, a second insulation layer 160, an insulating interlayer 170, a diaphragm pad 182, a back plate pad 184, a first pad electrode 192 and a second pad electrode 194.

In particular, the first insulation layer 150 may be formed on an upper face of the substrate 110 and may be located in the peripheral region SA.

The second insulation layer 160 may be disposed over the substrate 110 having the back plate 140 and the first insulation layer 150 to cover a top surface of the back plate 140. The second insulation layer 160 may include a portion bended from outside of the back plate to form a chamber portion 162. The chamber portion 162 may be located in the peripheral region SA. The chamber portion 162 may define a side portion of a chamber.

As shown in FIG. 1, the chamber portion 162 may be spaced apart from the anchor 130 and may have a dam shape so as to surround the anchor 130. The second insulation layer 160 is spaced apart from the diaphragm 120 and the anchor 130 to form the air gap AG between the diaphragm 120 and the back plate 140. As shown in FIG. 2, the chamber portion 162 makes contact with an upper face of the substrate 110 such that the second insulation layer 160 having the chamber portion 162 may support the back plate 140 which is coupled to a lower face of the second insulation layer 160. As a result, the back plate 140 can be kept apart from the diaphragm 120.

A plurality of acoustic holes 142 is formed through the back plate 140 and the second insulation layer 160 through which acoustic waves pass. The acoustic holes 142 penetrate through the back plate 140 and the second insulation layer 160 and can communicate with the air gap AG.

In an example embodiment, the back plate 140 may have a plurality of dimple holes 144, and the second insulation layer 160 may have a plurality of dimples 164 formed at positions corresponding to those of the dimple holes 144. The dimple holes 144 penetrate through the back plate 140, and the dimples 164 are provided at positions where the dimple holes 144 are formed.

The dimples 164 may prevent the diaphragm 120 from being coupled to a lower face of the back plate 140. That is, when the sound reaches to the diaphragm 120, the diaphragm 120 can be bent in a semicircular shape toward the back plate 140, and then can return to its initial position. A bending degree of the diaphragm 120 may vary depending on the sound pressure and may be increased to such an extent that an upper face of the diaphragm 120 makes contact with the lower face of the back plate 140. When the diaphragm 120 is bent so much as to contact the back plate 140, the diaphragm 120 may attach to the back plate 140 and may not return to the initial position. According to example embodiments, the dimples 164 may protrude from the lower face of the back plate 140 toward the diaphragm 120. Even when the diaphragm 164 is severely bent so much that the diaphragm 120 contacts the back plate 140, the dimples 164 may make the diaphragm 120 and the back plate 140 to be separated from one another so that the diaphragm 120 can return to the initial position.

The diaphragm pad 182 may be formed on the upper face of the first insulation layer 150. The diaphragm pad 182 may be electrically connected to the diaphragm 120 and may be located in the peripheral region SA.

The insulating interlayer 170 may be formed on the first insulation layer 150 having the diaphragm pad 182. The insulating interlayer 170 is disposed between the first insulation layer 150 and the second insulation layer 160, and is located in the peripheral region SA. Here, the first insulation layer 150 and the insulating interlayer 170 may be located outside from the chamber portion 162, as shown in FIG. 2. Further, the first insulation layer 150 and the insulating interlayer 170 may be formed using silicon oxide.

The back plate pad 184 may be formed on an upper face of the insulating interlayer 170. The back plate pad 184 is electrically connected to the back plate 140 and may be located in the peripheral region SA.

The diaphragm pad 182 is exposed through a first contact hole CH1 formed by partially removing the second insulation layer 160 and the insulating interlayer 170. The back plate pad 184 is exposed through a second contact hole CH2 formed by partially removing the second insulation layer 160.

The first and second pad electrodes 192 and 194 may be formed on the second insulation layer 160. The first pad electrode 192 is located in the first contact hole CH1 to make contact with the diaphragm pad 182. On other hands, the second pad electrode 194 is located in the second contact hole CH2 and makes contact with the back plate pad 184. Here, the first and second pad electrodes 192 and 194 may be transparent electrodes.

Hereinafter, a method of manufacturing a MEMS microphone will be described in detail with reference to the drawings.

FIG. 3 is a flow chart illustrating a method of manufacturing a MEMS microphone in accordance with an example embodiment of the present invention. FIG. 4 is a cross sectional view illustrating a step of forming anchor holes in FIG. 3. FIG. 5 is a plan view illustrating the anchor holes in FIG. 4. FIGS. 6 and 7 are cross sectional views illustrating a step of forming the diaphragm and the anchor in FIG. 3.

Referring to FIGS. 3 to 5, according to an example embodiment of a method for manufacturing a MEMS microphone, a first insulation layer 150 is formed on a substrate 110 (step S110).

Next, the first insulation layer 150 is patterned to form one anchor hole 152 for forming the anchor 130 (see FIG. 2) (step S120). The anchor hole 152 may be formed in the peripheral area SA and the substrate 110 may be partially exposed through the anchor hole 152. The anchor hole 152 extends along a circumference of a vibration area VA, as shown in FIG. 5, and may be formed in a broken ring shape to at least partially circumscribe the vibration area VA. Since the anchor hole 152 extends along the circumference of the vibration area VA, the anchor 130 may be formed in a dam shape in a subsequent step.

Referring to FIGS. 3, 6, and 7, a first silicon layer 20 is formed on the first insulation layer 150 having the anchor hole 152 formed thereon, as shown in FIG. 6. The first silicon layer 20 is patterned to form a diaphragm 120 and an anchor 130 (step S130).

Prior to patterning the first silicon layer 20, impurities may be doped into the vibration region VA of the first silicon layer 20 through an ion implantation process to form the diaphragm 120 having a relatively low resistance in the vibration region VA. Further, the anchor 130 is formed in the anchor hole 152 which is formed in the peripheral area SA to make contact with the substrate 110.

While patterning the first silicon layer 20, a plurality of vent holes 122 may be formed. Further, while forming the diaphragm 120 through the ion implantation process, a diaphragm pad 182 may be formed on the first insulation layer 150 and in the peripheral area SA to be electrically connected to the diaphragm 120.

Referring to FIGS. 2 and 3, a sacrificial layer (not shown) is formed on the first insulation layer 150 to cover the diaphragm 120 and the anchor 130 (step S140).

Then, a second silicon layer is formed on the sacrificial layer and then the second silicon layer is patterned to form a back plate 140 having dimple holes 144 in the vibration area VA. At this time, a back plate pad 184 may be formed in the peripheral area SA as well. Further, the back plate 140 and the back plate pad 184 may be doped with impurities through an ion implantation process.

Next, a second insulation layer 160 having a chamber portion 162 is formed on the sacrificial layer to cover the back plate 140 (step S160). Prior to forming the second insulation layer 160, the sacrificial layer and the first insulation layer 150 may be patterned to form a chamber hole (not shown) to partially expose an upper face of the substrate 110 in the peripheral region SA in order to define a position for the chamber portion 162

Even though not shown in detail in drawings, a method of manufacturing a MEMS microphone according to an embodiment of the present invention, after forming the second insulation layer (step S160), the second insulation layer 160 and the sacrificial layer (not shown) may be patterned to form a first contact hole CH1 to expose the diaphragm pad 182. On the other hand, the second insulation layer 160 is patterned to form a second contact hole CH2 to expose the back plate pad 184. Further, a first pad electrode 192 and a second pad electrode 194 may be formed on the second insulation layer 160 through which the first and second contact holes CH1 and CH2 are formed.

The second insulation layer 160 and the back plate 140 are patterned to form the acoustic holes 142 through the second insulation layer 160 and the back plate 140 (step S170).

Subsequently, the substrate 110 is patterned to form a cavity 112 in the vibration region VA (step S180).

An etchant is supplied to the first insulation layer 150 through the cavity 112 to remove a portion of the first insulation layer 150, located under the diaphragm 120. Only a portion of the second insulation layer 160 located outside the chamber portion 162 is left (step S190). Compared with the conventional art of a MEMS microphone, which requires a plurality of anchors that may hinder the etchant from flowing smoothly, only one anchor 130 need be provided to surround the vibration area VA (see FIG. 1). Therefore, since a portion of the first insulation layer 150 located beneath the diaphragm 120 is easily removed, the portion of the first insulation layer 150 can be completely removed. As a result, the diaphragm 120 can be normally bent and can smoothly return to its initial position in response to the acoustic pressure and thus a buckling phenomenon of the diaphragm 120, which may occur due to a remnant insulation layer located under the diaphragm 120, can be prevented.

Subsequently, a portion of the sacrifice layer, located over the diaphragm 120 and the anchor 130 is removed to form the air gap AG (step S210). The vent holes 122 of the diaphragm 120 may serve as a flow path of the etchant for removing the portion of the sacrificial layer. When the air gap AG is formed, only a portion of the sacrificial layer located outside the chamber portion 162 remains to form an insulating interlayer 170. Thus, the MEMS microphone 101 shown in FIG. 2 can be manufactured.

According to a method of manufacturing the MEMS microphone 101 as described above, one anchor hole 152 for forming the anchor 130 is formed in the shape of a ring with extending along the vibration area VA, Thus, the portion of the first insulation layer 150 disposed under the diaphragm 120 and around the anchor 130 can be completely removed. In addition, since the etchant for removing the sacrificial layer can flow through the vent hole 122 in step S210, process efficiency can be improved.

FIG. 8 is a plan view illustrating a MEMS microphone in accordance with an example embodiment of the present invention. FIG. 9 is a cross sectional view taken along a line II-II' as depicted in FIG. 8.

Referring to FIGS. 8 and 9, a MEMS microphone 102 according to an example embodiment of the present invention is identical to the MEMS microphone 101 in FIGS. 1 and 2 except for a diaphragm 210 and anchors 220. The same elements as those of the MEMS microphone 101 shown in FIG. 1 will not be described again.

Specifically, the diaphragm 210 may be provided over a substrate 110, and the anchors 220 may be formed to be adjacent to an end of the diaphragm 210.

The anchors 220 may be formed in a plurality of positions, and the anchors 220 may be located in a peripheral area SA. As shown in FIG. 8, the anchors 220 may be spaced apart from one another along a circumference of the diaphragm 210, and may extend along the circumference of the diaphragm 210 to have a dam shape entirely.

In an example embodiment of the present invention, each of the anchors 220 may have an arc shape as shown in FIG. 9

The diaphragm 210 may have a plurality of slits 212 which is positioned between the anchors 220. As shown in FIG. 9, the slits 212 may be formed by partially removing the diaphragm 210. The slits 212 are positioned between two adjacent anchors. Each of the slits 212 may serve as a flow path of an etchant for removing a portion of the sacrificial layer, located between the diaphragm 210 and a back plate 140.

According to example embodiments of the present invention, the anchors 220, each having a dam shape, can stable support the diaphragm 120. Thus, a possibility that the first insulation layer partially remains between the anchors 220 may be reduced. Further, the MEMS microphone 102 can prevent the buckling phenomenon of the diaphragm 210 which may occur due to a remnant of the first insulation layer located between the anchors 220 from happening, and acoustic waves can flow smoothly.

Further, the MEMS microphone 102 may includes the slits 212 formed between the anchors 220 so that each of the slits 212 can serve as a flow path of acoustic waves. Furthermore, the first insulation layer positioned under the diaphragm can be easily removed. In addition, the slits 212 can serve as a flow path of an etchant for removing the sacrificial layer between the diaphragm 210 and the back plate 140 to easily remove a portion of the sacrificial layer.

Hereinafter, the manufacturing process of the MEMS microphone 102 will be described in detail with reference to the drawings.

FIGS. 10 to 12 are schematic cross sectional views illustrating a method of manufacturing a MEMS microphone shown in FIG. 8. FIG. 13 is a plan view for showing the anchor holes of FIG. 10.

Referring to FIGS. 10 to 13, a method of manufacturing a MEMS microphone 102 includes the steps identical to those of the method of manufacturing a MEMS microphone explained with reference to FIG. 3, except for those steps consisting of forming the diaphragm 210 and the anchors 220. Descriptions that would be redundant with those previously provided are omitted, and like reference numerals are used herein to describe like parts.

According to a method of manufacturing the MEMS microphone 102, after a first insulation layer 150 is formed on the substrate 110 and then the first insulation layer 150 is patterned to form a plurality of anchor holes 154 for forming an anchor 220. The anchor holes 154 are formed in a peripheral area SA, and the substrate 110 may be partially exposed through the anchor holes 154 as shown in FIG. 10. As shown in FIG. 13, the anchor holes 154 may be spaced apart from one another around a vibration area VA to surround the vibration area VA. In addition, each of the anchor holes 154 is formed to extend around the vibration area VA. Accordingly, the anchors 220 to be formed in the anchor holes 154 in the next step may be formed in a dam shape, respectively.

As shown in FIG. 11, a first silicon layer 20 is deposited on the first insulation layer 150, and then the first silicon layer 20 is patterned to form the diaphragm 210 (see FIG. 8) and the anchors 220. As depicted in FIG. 12, the anchors 220 are formed in the anchor holes 154 and make contact with the substrate 110, and the slits 212 are formed between the anchors 220

According to an example embodiment of a method of manufacturing the MEMS microphone 102, the anchors 220 are formed in a dam shape and the slits 212 are formed between the anchors 220. Thus, a portion of the first insulation layer 150 around the anchors 220 can be completely removed. In addition, am etchant for removing a sacrificial layer between the diaphragm 210 and a back plate 140 can flow smoothly through the slits 212, process efficiency can be improved.

Although the MEM microphone has been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

What is claimed is:

1. A method of manufacturing a MEMS microphone, the method comprising:
    forming an insulation layer on a substrate being divided into a vibration area and a peripheral area surrounding the vibration region;
    patterning the insulation layer to form an anchor hole for forming an anchor in the peripheral area, the anchor hole extending along a circumference of the vibration area;
    forming a diaphragm and an anchor on the insulation layer through which the anchor hole is formed, the anchor being connected to the diaphragm;
    forming a sacrificial layer on the insulation layer to cover the diaphragm and the anchor;
    forming a back plate on the sacrificial layer to face the diaphragm;
    patterning the back plate to form a plurality of acoustic holes which penetrate through the back plate;
    patterning the substrate to form a cavity in the vibration area to at least partially expose a lower face of the insulation layer;
    removing a portion of the insulation layer, which is located under the diaphragm through an etching process using the cavity as a mask; and
    removing a portion of the sacrificial layer, which is arranged between the diaphragm and the anchor.

2. The method of claim 1, wherein the anchor hole is formed in at least a partial a ring shape to surround the vibration area.

3. The method of claim 1, wherein forming the diaphragm includes form vent holes in the peripheral area, each of the vent holes serving as a flow path of the etchant for removing the sacrificial layer.

4. The method of claim 1, wherein the anchor hole is formed for a plurality of anchors, each of the plurality of anchors spaced apart from each other along a circumference of the vibration area.

5. The method of claim 3, further comprising:
    patterning the diaphragm to form a plurality of slits in the peripheral area, the silts being spaced apart from each other along a circumference of the vibration area, and each of the slits serving as a flow path of the etchant for removing the sacrificial layer.

* * * * *